(12) United States Patent
Cheng et al.

(10) Patent No.: US 6,277,765 B1
(45) Date of Patent: Aug. 21, 2001

(54) LOW-K DIELECTRIC LAYER AND METHOD OF MAKING SAME

(75) Inventors: Peng Cheng, Campbell; Brian S. Doyle, Cupertino; Chien Chiang, Fremont; Mark Thiec-Hien Tran, San Jose, all of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/376,510

(22) Filed: Aug. 17, 1999

(51) Int. Cl.$^7$ .................................................. H01L 21/31
(52) U.S. Cl. .................... 438/773; 438/770; 438/774; 438/788; 438/594; 204/151.74
(58) Field of Search ...................... 438/758, 770, 438/773, 774, 788; 204/151.74

(56) References Cited

U.S. PATENT DOCUMENTS

| | | | |
|---|---|---|---|
| 5,453,394 | * 9/1995 | Yonehara et al. | 437/62 |
| 5,504,022 | * 4/1996 | Nakanishi et al. | 437/43 |
| 5,969,393 | * 10/1999 | Noguchi | 257/396 |
| 6,080,032 | * 6/2000 | Alwan | 445/50 |
| 6,143,655 | * 11/2000 | Forbes et al. | 438/686 |
| 6,456,374 | * 12/2000 | Forbes et al. | 427/97 |

FOREIGN PATENT DOCUMENTS

01087095 * 4/1989 (JP) ........................................ 438/427

* cited by examiner

Primary Examiner—Eddie C. Lee
Assistant Examiner—Paul E Brock, II
(74) Attorney, Agent, or Firm—Raymond J. Werner

(57) ABSTRACT

A low dielectric constant material, suitable for use as an interlayer dielectric in microelectronic structures includes a porous silicon oxide layer. In a further aspect of the present invention, a porous oxide of silicon is formed by the room temperature oxidation of porous silicon. The room temperature oxidation is achieved by exposing a porous silicon layer to a solution of hydrochloric acid, hydrogen peroxide, and water, in the presence of a metal catalyst.

27 Claims, 4 Drawing Sheets

US 6,277,765 B1

LOW-K DIELECTRIC LAYER AND METHOD OF MAKING SAME

BACKGROUND OF THE INVENTION

1. Field of the Invention

The present invention relates generally to microelectronic structures and fabrication methods, and more particularly to the formation of layers having low dielectric constants.

2. Background

Advances in semiconductor manufacturing technology have led to the development of integrated circuits having multiple levels of interconnect. In such an integrated circuit, patterned conductive material on one interconnect level is electrically insulated from patterned conductive material on another interconnect level by films of material such as silicon dioxide. Connections between the conductive material at the various interconnect levels are made by forming openings in the insulating layers and providing an electrically conductive structure such that the patterned conductive material from different interconnect levels are brought into electrical contact with each other. These structures are often referred to contacts or vias.

A consequence of having multiple layers of patterned conductive material separated by an insulating layer is the formation of undesired capacitors. The parasitic capacitance between patterned conductive material, or more simply, interconnects, separated by insulating material on microelectronic devices contributes to effects such as RC delay, power dissipation, and capacitively coupled signals, also known as cross-talk.

One way to reduce the unwanted capacitance between the interconnects is to use an insulating material with a lower dielectric constant. Various organic polymers have been used to form these insulating layers because their dielectric constants tend to be less than the dielectric constant of the most commonly used insulator, which is silicon dioxide. Unfortunately, organic polymers typically suffer from lower mechanical strength and hardness than silicon dioxide.

What is needed is an insulating layer that overcomes the deficiencies of organic polymer dielectric layers, while still providing low parasitic capacitance between interconnect layers, and methods of making such an insulating layer.

SUMMARY OF THE INVENTION

Briefly, a low dielectric constant material, suitable for use as an interlayer dielectric in microelectronic structures includes a porous silicon oxide layer.

In a further aspect of the present invention, a porous oxide of silicon is formed by the room temperature oxidation of porous silicon. A metal catalyzes the room temperature oxidation.

DETAILED DESCRIPTION

Terminology

The terms, chip, integrated circuit, monolithic device, semiconductor device, and microelectronic device, are often used interchangeably in this field. The present invention is applicable to all the above as they are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal suicides are examples of other conductors.

The terms contact and via, both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

The expression, dual damascene, refers to a structure wherein a via opening exists which provides a pathway from the bottom of a damascene trench to an underlying layer of conductive material.

The expression, low dielectric constant material, refers to materials having a lower dielectric constant than silicon dioxide.

The term vertical, as used herein, means substantially perpendicular to the surface of a substrate.

Overview

In order to manufacture integrated circuits with low parasitic capacitance between conductors, it is desirable to electrically isolate the conductors from each other with an insulator having a low dielectric constant. Materials such as fluorinated oxides and organic polymers have lower dielectric constants than traditional microelectronic insulators such as undoped silicon dioxide. By increasing the porosity of silicon dioxide based insulators, the dielectric constant can be reduced.

Embodiments of the present invention provide a porous oxide of silicon as a component of an interlayer dielectric structure. Additionally, methods in accordance with the present invention allow the formation of dual damascene trench and via structures in the interlayer dielectric, as well as allow for the room temperature formation of the low-k interlayer dielectric structure.

Method

Figure 1:
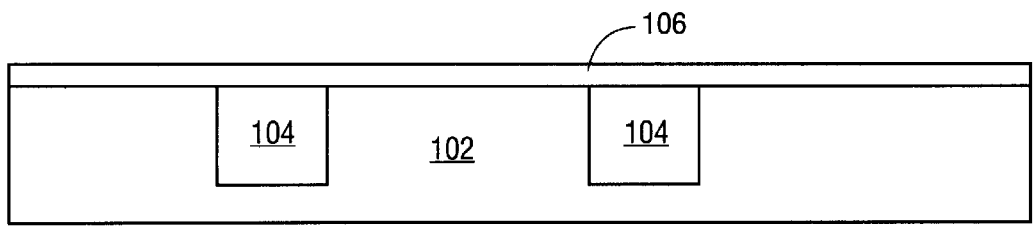
FIG. 1 is a schematic cross-section of a partially fabricated microelectronic device showing interconnect lines surrounded at bottom and vertical sides by an insulating layer, and a barrier layer covering the top surfaces of the interconnect and the insulating layer.

Referring to FIG. 1, a partially fabricated microelectronic device having 20 interconnect lines 104 surrounded at bottom and vertical sides by an insulating layer 102, and a barrier layer 106 covering the top surfaces of interconnect lines 104 and insulating layer 102 is shown in cross-section. Insulating layer 102 may be a material such as, but not limited to, silicon dioxide. Furthermore, insulating layer 102 may be disposed on a substrate, such as a semiconductor wafer, and the substrate may have any number of underlying layers of insulating, conducting, and semiconducting materials contained therein. Barrier layer 106 may be formed by operations such as, but not limited to, depositing a layer of silicon nitride or depositing a layer of silicon oxynitride. Alternatively a silicon layer may be formed and then converted to a material such as silicon nitride or silicon oxynitride.

Figure 2:
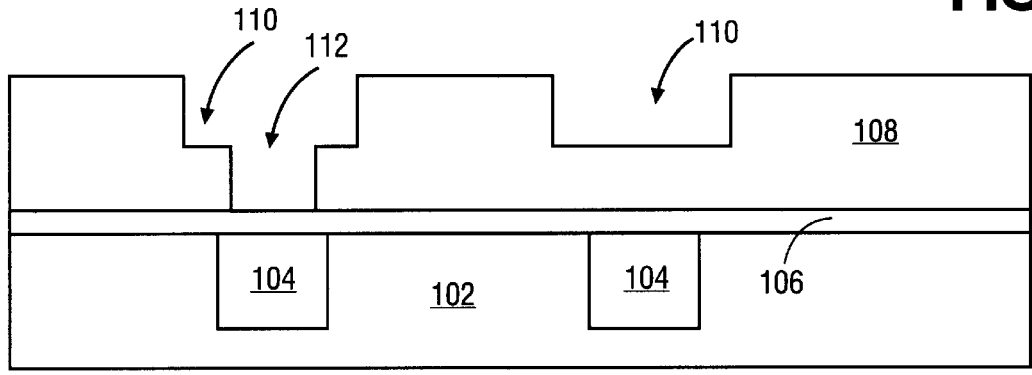
FIG. 2 is a schematic cross-section of FIG. 1 after the deposition of an amorphous silicon layer, and the formation of damascene trenches and vias in the amorphous silicon layer.

FIG. 2 shows the structure of FIG. 1, after further processing operations are performed such that an amorphous silicon layer 108 is formed over barrier layer 106. Still further processing operations are performed such that damascene trenches 110 and via opening 112 are formed. Methods for the formation of amorphous silicon layer 108, damascene trenches 110 and via openings 112 are known in this field, and any such method may be used to form the structures shown in FIG. 2. In the illustrative embodiment amorphous silicon layer 108 is formed by an low pressure chemical vapor deposition operation with silane gas as a source of silicon. Alternatively, silicon layer 108 may be formed by sputtering. It should be appreciated that the thickness of silicon layer 108 is a function of the desired thickness of the insulating layer which is to be formed from silicon layer 108. Typical thicknesses for such a layer are in the range of $0.8\mu$ to $1.2\mu$. The present invention is not limited to any particular thickness of the silicon layer, nor is it limited to any particular method of formation of the silicon layer.

While amorphous silicon layer 108 has been described as being formed by way of relatively low temperature methods such as LPCVD and sputtering, it should be noted that a polysilicon layer can also function as the starting material for conversion to a porous oxide of silicon. However, polysilicon deposition generally involves temperatures that are too high for use when materials having low melting temperatures have already been formed on underlying layers of the microelectronic device.

Figure 3:
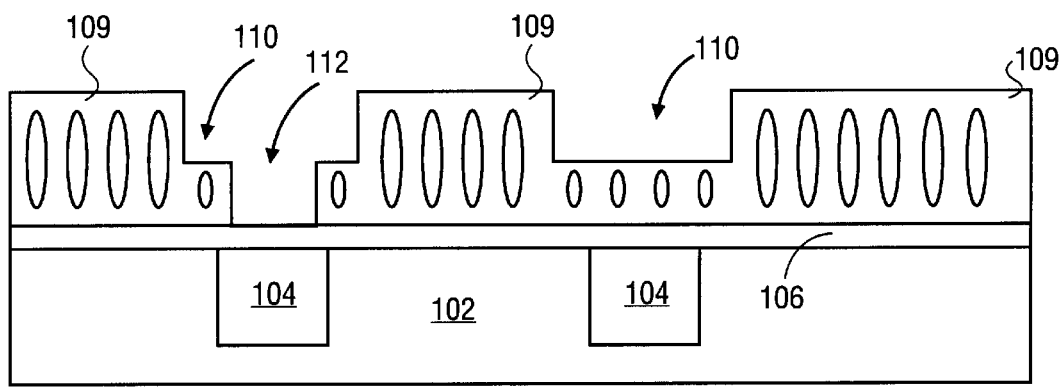
FIG. 3 is a schematic cross-section of FIG. 2 after the amorphous silicon layer has been converted to a porous silicon layer in accordance with the present invention.

FIG. 3 shows the structure of FIG. 2, after further processing operations are performed such that amorphous silicon layer 108 is substantially converted to a porous silicon layer 109. This porous silicon may be nonporous, mesoporous, or macroporous. Processes for conversion of silicon to porous silicon are well known in this field. Such processes include, but are not limited to, immersing silicon in an HF solution with an applied electrical bias.

Figure 4:
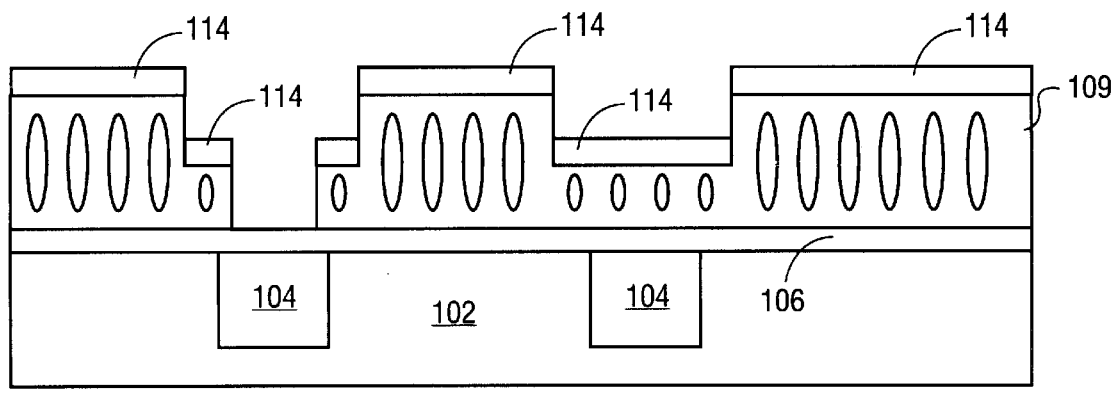
FIG. 4 is a schematic cross-section of FIG. 3 after a metal catalyst layer is deposited in accordance with the present invention.

FIG. 4 shows the structure of FIG. 3, after further processing operations are performed such that a metal layer 114 is formed over the surfaces of porous silicon layer 109. In the illustrative embodiment, metal layer 114 is a layer of nickel approximately 100 angstroms thick is deposited over porous silicon layer 109. Other metals such as cobalt, or molybdenum may be used.

Figure 5:
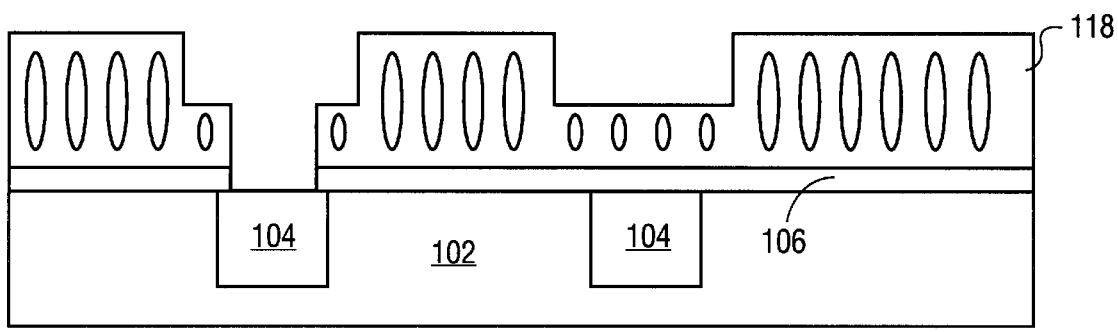
FIG. 5 is a schematic cross-section of FIG. 4 after the portions of the barrier layer at the bottom of the vias are etched.

FIG. 5 shows the structure of FIG. 4, after further processing operations are performed such that porous silicon layer 109 is converted to porous oxide layer 118. Porous oxide 118 is comprised substantially of silicon dioxide in the illustrative embodiment.

Figure 6:
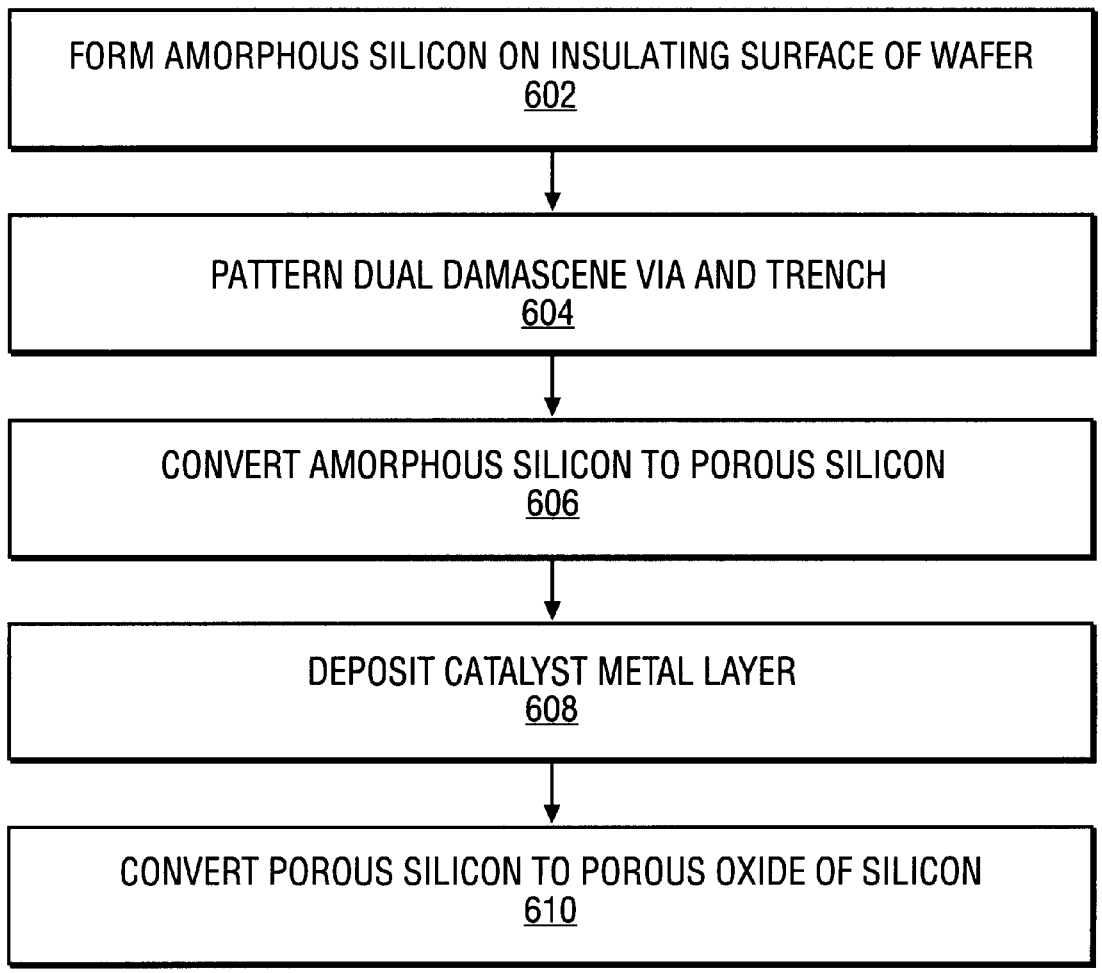
FIG. 6 is a process flow diagram in accordance with the present invention.

Referring to FIG. 6, an exemplary process 600 embodying the present invention is illustrated by way of a flow diagram. In the illustrative embodiment of FIG. 6, an amorphous silicon layer is deposited, patterned for dual damascene metallization, converted to porous silicon, and then further converted, with the aid of a catalyst to a porous oxide of silicon.

As shown in FIG. 6, an amorphous silicon layer is formed on an insulating surface of a wafer (block 602). The wafer may have been previously processed so that various active or passive components and conductive pathways for interconnecting those components are formed on and in the wafer. In the illustrative embodiment the amorphous silicon layer is approximately $1\mu$ thick. The silicon layer may be formed by any suitable method of forming an amorphous silicon layer, including but not limited to, the decomposition of silane in a low pressure chemical vapor deposition (LPCVD) reactor or sputtering silicon onto a substrate. With respect to the thickness of the amorphous silicon layer, typical layers are in the range of $0.8\mu$ to $1.2\mu$, however the thickness of the amorphous silicon layer is function of how thick the porous oxide layer is desired to be. In other words, since the porous oxide thickness is determined by the thickness of the initial amorphous silicon layer, the thickness of amorphous silicon layer is set so as to produce the desired porous oxide thickness. The desired porous oxide thickness is typically selected based on factors such as, including but not limited to, whether a subtractive or damascene metal process is to be used, and the interlayer capacitance which can be tolerated by a particular circuit design to be implemented with the process.

The amorphous silicon layer is patterned (block 604) by known operations to form vias and trenches in accordance with a dual damascene metallization process.

Subsequent to the formation of dual damascene vias and trenches, the amorphous silicon is converted (block 606) to a porous silicon. This porous silicon may be nonporous, mesoporous, or macroporous. In the illustrative embodiment of FIG. 6, the conversion of amorphous silicon to porous silicon is accomplished by one of several known processes, including but not limited to immersion in HF under bias.

A metal layer is then deposited over the porous silicon (block 608). The metal acts as a catalyst for a subsequent low temperature oxidation operation. Metals such as nickel, cobalt or molybdenum may be used. In the embodiment illustrated in FIG. 6, a layer of nickel, approximately 100 angstroms thick, is deposited over the porous silicon by a plasma vapor deposition (PVD) operation. Such a metal layer may also be deposited by a sputter operation. The coverage of the porous silicon by the metal layer may be, but is not required to be, conformal. However, it is desirable to have the metal layer cover the surface of those portions of the porous silicon which are to be converted to porous oxide. The metal should cover the trenches so that oxide will form below the trenches as shown in FIG. 4.

The wafer, now including the metal coated porous silicon layer is immersed in a bath of room temperature hydrochloric acid (HCl), hydrogen peroxide ($H_2O_2$) and water ($H_2O$). The ratio of $HCl:H_2O_2:H_2O$ is preferably in the range of 3:1:1 to 5:1:1. However, other ratios in the range of approximately 3:1:1 to 10:1:1 may also be used. Immersion in this bath causes a reaction, catalyzed by the metal layer, in which the porous silicon is converted to a porous oxide of silicon.

The oxidation rate has been observed to be as high as 2000 angstroms per minute at 25° C. with Ni as the catalyst.

Portions of the porous silicon that are not covered with the metal layer will react with the $HCl:H_2O_2:H_2O$ bath but the reaction will be slower and therefore the porous oxide thickness will not be as great.

Figure 7:
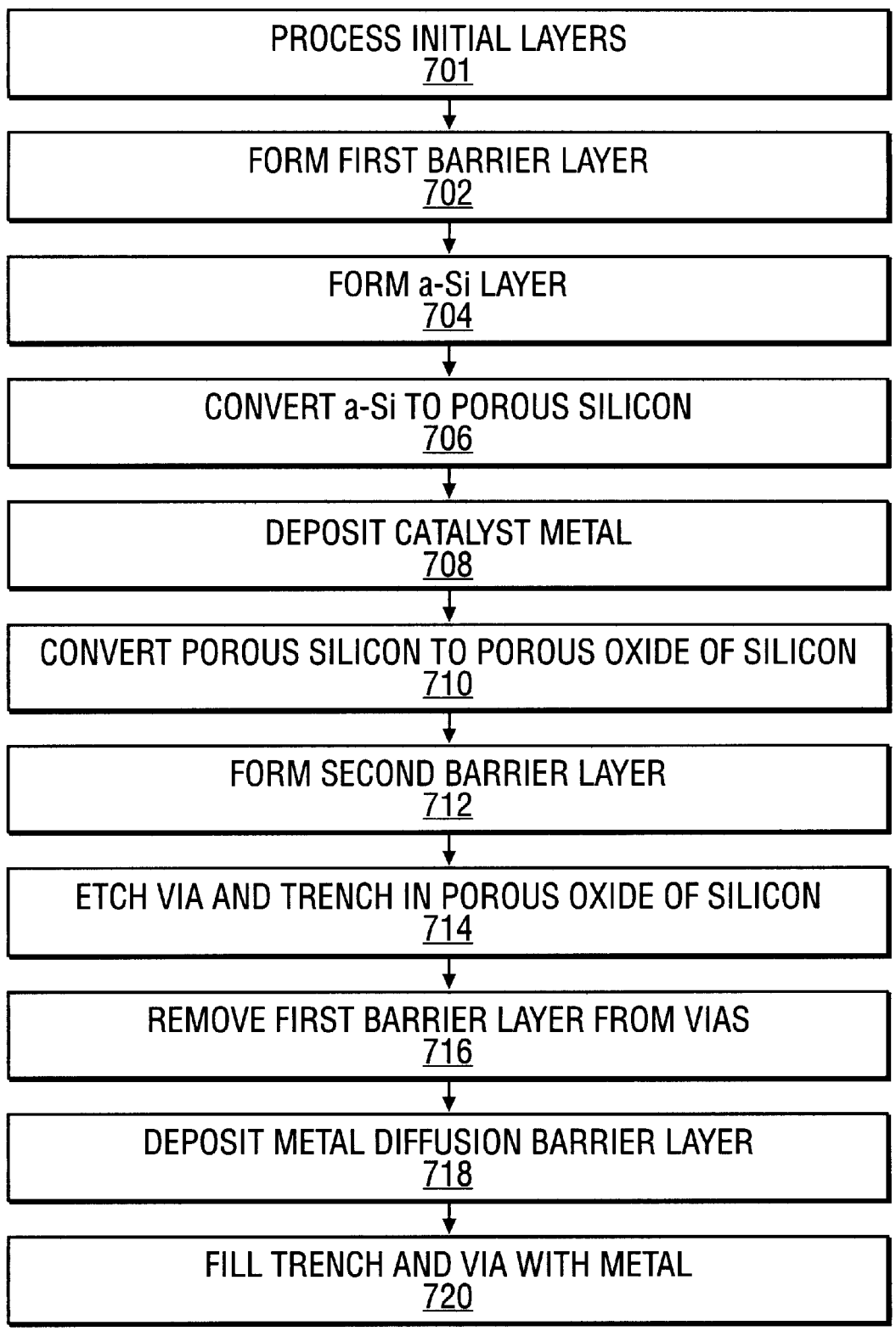
FIG. 7 is a process flow diagram in accordance with the present invention.

Referring to FIG. 7, an alternative process 700 embodying the present invention is illustrated by way of a flow diagram. Alternative process 700 also indicates the operations used to fill damascene trenches and vias with metal. In the illustrative embodiment of FIG. 7, an amorphous silicon layer is deposited over a first barrier layer, converted to porous silicon, further converted to a porous oxide of silicon with the aid of a catalyst, covered with a second barrier layer, and patterned for dual damascene metallization. That portion of the first barrier layer exposed by the dual damascene patterning is removed, a metal migration barrier is deposited and the damascene trenches and via are filled with metal.

After processing a wafer through known operations (block 701) to form various electronic components and interconnections, the wafer is at a stage wherein an interlayer dielectric is required to be formed. In the exemplary embodiment of FIG. 7, interconnect lines and intralayer dielectric have been processed, typically by chemical mechanical polishing, to produce a substantially planar surface. A barrier layer is then formed (block 702) over the planar surface. This barrier layer may be formed from a material such as silicon nitride. Other materials may be used as the barrier layer, however any such material should have etch characteristics that are different from those of porous oxides of silicon.

A layer of amorphous silicon is formed over the barrier layer (block 704). In the illustrative embodiment of FIG. 7, the amorphous silicon layer has a thickness of approximately $1\mu$, although other thicknesses may be selected. As noted above, the thickness of the silicon layer is selected to match the desired thickness of the interlayer dielectric that will be formed therefrom. The amorphous silicon layer is typically formed by a deposition process in which silane is decomposed in an LPCVD reactor. Alternatively this silicon layer may be formed by sputtering.

Subsequently the amorphous silicon layer is converted to a porous silicon layer (block 706). This porous silicon may be nonporous, mesoporous, or macroporous. The conversion of amorphous silicon to porous silicon is well known in this field and has been described extensively in the literature. In the illustrative embodiment of FIG. 7, the conversion of amorphous silicon to porous silicon is accomplished by any one of several known methods, including but not limited to immersion in an HF solution with bias applied.

A metal layer is deposited onto the surface of the porous silicon layer (block 708). This metal acts as a catalyst for the room temperature oxidation of the porous silicon. Metals such as nickel, cobalt or molybdenum may be used. In the embodiment illustrated in FIG. 7, a layer of nickel, approximately 100 angstroms thick, is deposited over the porous silicon by a plasma vapor deposition (PVD) operation. Such a metal layer may also be deposited by a sputter operation.

The porous silicon is then converted to a porous oxide of silicon (block 710). The oxidation is accomplished by immersing the wafer in a bath of room temperature hydrochloric acid (HCl), hydrogen peroxide ($H_2O_2$) and water ($H_2O$). The ratio of $HCl:H_2O_2:H_2O$ is preferably in the range of 3:1:1 to 5:1:1. However, other ratios in the range of approximately 3:1:1 to 10:1:1 may also be used. Immersion in this bath causes a reaction, catalyzed by the metal layer, in which the porous silicon is converted to a porous oxide of silicon. The oxidation rate has been observed to be as high as 2000 angstroms per minute at 25° C. with Ni as the catalyst.

Conclusion

Embodiments of the present invention provide a low-k interlayer dielectric with mechanical strength adequate to support additional layers of conductors and insulators. The low-k interlayer dielectrics in accordance with the present invention also provide good adhesion characteristics.

An advantage of embodiments of the present invention is that an oxide of silicon is formed at approximately room temperature thereby extending the thermal budget for a given semiconductor process.

It will be appreciated that the low-k interlayer dielectric structures can be used between various interconnect levels. For example, between a first metal interconnect level and a second metal interconnect level, a second metal interconnect level and a third metal interconnect level, and so on.

The present invention may be implemented with various changes and substitutions to the illustrated embodiments. For example, the present invention may be implemented on substrates comprised of materials other that silicon, for example gallium arsenide, sapphire, and so on.

Although the illustrative embodiments have been described in connection with the use of an amorphous silicon layer, it should be noted that a polysilicon layer may also be converted to a porous oxide of silicon through the metalcatalyzed room temperature oxidation discussed above. However, polysilicon generally requires a higher temperature for its formation than does amorphous silicon.

In a further variation, the porous silicon may be converted to a porous oxide at room temperature without a metal catalyst deposited thereon. In a such an alternative the reaction rate is substantially slower.

It will be readily understood by those skilled in the art that various other changes in the details, materials, and arrangements of the parts and steps which have been described and illustrated in order to explain the nature of this invention may be made without departing from the principles and scope of the invention as expressed in the subjoined claims.

What is claimed is:

1. A method of forming a dielectric layer, comprising:
forming a layer of silicon over a substrate;
converting the silicon to porous silicon;
forming a layer of metal over the porous silicon; and
converting the porous silicon to a porous oxide of silicon.

2. The method of claim 1, wherein the substrate comprises a semiconductor wafer.

3. The method of claim 1, wherein the substrate comprises a semiconductor wafer having an electrically insulating material disposed on a surface thereof.

4. The method of claim 1, wherein converting the silicon to porous silicon comprises immersing the substrate in an HF solution with a bias applied.

5. The method of claim 1, wherein the metal is selected from the group consisting of nickel, cobalt, and molybdenum.

6. The method of claim 1, wherein converting the porous silicon to a porous oxide of silicon comprises exposing the porous silicon having a layer of metal thereon to a solution of HCl, $H_2O_2$, and $H_2O$.

7. The method of claim 6, wherein the solution of HCl, $H_2O_2$, and $H_2O$ is approximately room temperature.

8. The method of claim 6, wherein a ratio of HCl to $H_2O_2$ to $H_2O$ is in the range of approximately 3:1:1 to 5:1:1.

9. The method of claim 6, wherein a ratio of HCl to $H_2O_2$ to $H_2O$ is in the range of approximately 3:1:1 to 10:1:1.

10. The method of claim 1, wherein the silicon comprises amorphous silicon.

11. The method of claim 1, wherein the silicon comprises polysilicon.

12. A method of forming a low dielectric constant electrically insulating film comprising:

forming interconnect lines on an insulating substrate, the interconnect lines having insulating material disposed therebetween;

forming a substantially planar first barrier layer over the interconnect lines and the insulating material disposed therebetween;

depositing a layer of amorphous silicon over the first barrier layer;

converting the amorphous silicon to porous silicon;

depositing a layer of a catalyst over the porous silicon; and converting the porous silicon to a porous oxide of silicon.

13. The method of claim 12, further comprising forming a trench in the amorphous silicon.

14. The method of claim 12, further comprising forming a via in the amorphous silicon.

15. The method of claim 12, further comprising forming a dual damascene trench and via structure in the amorphous silicon, wherein the structure has surfaces.

16. The method of claim 12, wherein the barrier is a material selected from the group consisting of silicon nitride and silicon oxynitride.

17. The method of claim 13, further comprising forming a second barrier layer over at least a substantial portion of the trench.

18. The method of claim 14, further comprising forming a second barrier layer over at least a substantial portion of the via.

19. The method of claim 12, further comprising forming a trench in the amorphous silicon.

20. The method of claim 12, further comprising, forming a trench in the porous oxide of silicon.

21. The method of claim 12, further comprising, forming a via in the porous oxide of silicon.

22. The method of claim 12, further comprising, forming a dual damascene trench and via structure in the porous oxide of silicon.

23. A method of forming an interlayer dielectric on a wafer, comprising:

depositing a first barrier layer over a plurality of interconnect lines, the interconnect lines disposed on a surface of the wafer;

depositing an amorphous silicon layer over of the first barrier layer;

etching vias and trenches in the amorphous silicon layer;

converting, at approximately room temperature, the amorphous silicon layer to a porous silicon layer;

depositing a metal catalyst layer over the porous silicon layer;

immersing the wafer in a solution of hydrochloric acid, hydrogen peroxide, and water; and etching an exposed portion of the first barrier layer.

24. The method of claim 23, wherein the solution has a temperature approximately equal to room temperature.

25. The method of claim 23, wherein the metal catalyst is a metal selected from the group consisting of nickel, cobalt, and molybdenum.

26. The method of claim 23, wherein the metal catalyst layer is approximately 100 angstroms thick.

27. A method of forming an interlayer dielectric on a wafer, comprising:

depositing a first barrier layer over a plurality of interconnect lines, the interconnect lines disposed on a surface of the wafer;

depositing an amorphous silicon layer over of the first barrier layer;

converting, at approximately room temperature, the amorphous silicon layer to a porous silicon layer;

depositing a metal catalyst layer over the porous silicon layer;

immersing the wafer in a solution of hydrochloric acid, hydrogen peroxide, and water to form a porous oxide of silicon layer;

etching vias and trenches in the porous oxide of silicon layer; and etching an exposed portion of the first barrier layer.

* * * * *

UNITED STATES PATENT AND TRADEMARK OFFICE
CERTIFICATE OF CORRECTION

PATENT NO.   : 6,277,765 B1
DATED         : August 21, 2001
INVENTOR(S)  : Cheng et al.

It is certified that error appears in the above-identified patent and that said Letters Patent is hereby corrected as shown below:

Column 2,
Line 34, delete "suicides", insert -- silicides --.

Signed and Sealed this

Seventh Day of May, 2002

*Attest:*

JAMES E. ROGAN
*Director of the United States Patent and Trademark Office*

*Attesting Officer*